(12) United States Patent
Shen et al.

(10) Patent No.: US 9,991,475 B2
(45) Date of Patent: Jun. 5, 2018

(54) DISPLAY BACKPLANE, MANUFACTURING METHOD THEREOF AND DISPLAY DEVICE

(71) Applicant: Boe Technology Group Co., Ltd., Beijing (CN)

(72) Inventors: Wulin Shen, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 14/906,500

(22) PCT Filed: Aug. 13, 2015

(86) PCT No.: PCT/CN2015/086869
§ 371 (c)(1),
(2) Date: Jan. 20, 2016

(87) PCT Pub. No.: WO2016/145777
PCT Pub. Date: Sep. 22, 2016

(65) Prior Publication Data
US 2017/0110681 A1    Apr. 20, 2017

(30) Foreign Application Priority Data

Mar. 13, 2015  (CN) .......................... 2015 1 0111902

(51) Int. Cl.
| H01L 51/52 | (2006.01) |
| H01L 27/32 | (2006.01) |
| H01L 51/56 | (2006.01) |

(52) U.S. Cl.
CPC ........ H01L 51/529 (2013.01); H01L 27/3248 (2013.01); H01L 27/3258 (2013.01);
(Continued)

(58) Field of Classification Search
None
See application file for complete search history.

(56) References Cited

U.S. PATENT DOCUMENTS

| 7,230,594 B2 | 6/2007 | Miller et al. |
| 7,583,022 B2 * | 9/2009 | Cok ...................... H01L 51/529 |
| | | 313/46 |

(Continued)

FOREIGN PATENT DOCUMENTS

| CN | 1284694 | 2/2001 |
| CN | 101763777 | 6/2010 |

(Continued)

OTHER PUBLICATIONS

International Search Report and Written Opinion from PCT/CN15/86869 dated Nov. 3, 2015.
(Continued)

*Primary Examiner* — Lex Malsawma
(74) *Attorney, Agent, or Firm* — Calfee, Halter & Griswold LLP

(57) ABSTRACT

The present invention provides a display backplane and a manufacturing method thereof, as well as a display device. The display backplane comprising: a substrate; an array of organic light emitting elements and an array of transistors for driving and controlling the array of organic light emitting elements formed on the substrate; and a heat insulation layer formed between the array of organic light emitting elements and the array of transistors, wherein the heat insulation layer is provided with a heat insulation layer via hole, through which the array of transistors is connected with the array of organic light emitting elements. The display backplane provided in the present invention can reduce the conduction of heat generated by the array of organic light emitting elements during lighting to the array of transistors, thus avoiding problems caused thereby such as uneven display.

12 Claims, 1 Drawing Sheet

(52) U.S. Cl.
CPC ........ *H01L 27/3262* (2013.01); *H01L 51/524* (2013.01); *H01L 51/56* (2013.01)

(56) References Cited

U.S. PATENT DOCUMENTS

| | | | | |
|---|---|---|---|---|
| 2004/0076908 | A1* | 4/2004 | Oomachi | G11B 7/243 430/270.13 |
| 2005/0087769 | A1* | 4/2005 | Yamazaki | H01L 27/1214 257/202 |
| 2006/0022589 | A1* | 2/2006 | Cok | H01L 51/529 313/506 |
| 2013/0278144 | A1 | 10/2013 | Levermore et al. | |
| 2014/0077688 | A1 | 3/2014 | Weaver et al. | |
| 2016/0027718 | A1* | 1/2016 | Park | H01L 51/5237 165/80.3 |

FOREIGN PATENT DOCUMENTS

| | | |
|---|---|---|
| CN | 102220005 | 10/2011 |
| CN | 103331245 | 10/2013 |
| CN | 103515542 | 1/2014 |
| CN | 103682143 | 3/2014 |
| CN | 103843140 | 6/2014 |
| CN | 104347819 | 2/2015 |
| CN | 104659038 | 5/2015 |
| KR | 20060118268 | 11/2006 |

OTHER PUBLICATIONS

Office action from Chinese Application No. 241510111902.7 dated Mar. 28, 2017.
Second Office Action from Chinese Application No. 201510111902.7 dated Oct. 11, 2017.

* cited by examiner

DISPLAY BACKPLANE, MANUFACTURING METHOD THEREOF AND DISPLAY DEVICE

RELATED APPLICATIONS

The present application is the U.S. national phase entry of PCT/CN2015/086869, with an international filing date of Aug. 13, 2015 which claims the benefit of Chinese Patent Application No. 201510111902.7, filed on Mar. 13, 2015, the entire disclosures of which are incorporated herein by reference.

FIELD OF THE INVENTION

The present invention relates to the field of display technology, and in particular to a display backplane and a manufacturing method thereof, as well as a display device.

BACKGROUND ART

Oxide backplanes have attracted wide attention for their excellent performance. However, the performance of oxide backplanes are sensitive to factors such as heat and light, and this problem is even more prominent for an AMOLED display screen made of an oxide backplane. Since an active-matrix organic light-emitting diode (AMOLED) is driven by current, the temperature of the oxide backplane will easily rise during lighting, which influences the performances of the oxide backplane and thus gives rise to problems such as decreased display brightness, a shortened service lifetime and large-size unevenness of display brightness.

SUMMARY

In regard to deficiencies in the prior art, one goal of the present invention is to reduce the influence of heat generated by the OLED on the display backplane.

The present invention provides a display backplane, comprising: a substrate; an array of organic light emitting elements and an array of transistors for driving and controlling the array of organic light emitting elements formed on the substrate; and a heat insulation layer formed between the array of organic light emitting elements and the array of transistors, wherein the heat insulation layer is provided with a heat insulation layer via hole, through which the array of transistors is connected with the array of organic light emitting elements.

The above the present invention has a heat insulation layer formed between the array of organic light emitting elements and the array of transistors, wherein the heat insulation layer is provided with a heat insulation layer via hole, through which the array of transistors is connected with the array of organic light emitting elements. Thus, the conduction of heat generated by the array of organic light emitting elements during lighting to the array of transistors can be reduced, and accordingly problems caused thereby, such as uneven display, can be avoided.

According to embodiments of the present invention, the display backplane further comprises: a passivation layer formed between the array of organic light emitting elements and the array of transistors, wherein the heat insulation layer is positioned between the passivation layer and the bottom electrode of the organic light emitting element in the array of organic light emitting elements; and the passivation layer is provided with a passivation layer via hole formed therein, the position of which corresponds to that of the heat insulation layer via hole, and the drain of the transistor in the array of transistors is connected with the bottom electrode of the organic light emitting element in the array of organic light emitting elements via the passivation layer via hole and the heat insulation layer via hole.

Thus, mutual interferences between the array of organic light emitting elements and the array of transistors are avoided by taking advantage of the passivation layer. Moreover, the formation of a corresponding passivation layer via hole ensures the connection between the array of transistors and the array of organic light emitting elements.

According to embodiments of the present invention, the slope angle of the heat insulation layer via hole is smaller than or equal to 60°. With such a slope angle, breakage of the bottom electrode of the organic light emitting element in the array of organic light emitting elements can be avoided. Furthermore, the slope angle of the heat insulation layer via hole is 40-60°.

According to embodiments of the present invention, the display backplane further comprises: a heat conduction layer formed on a side of the array of the organic light emitting elements away from the array of the transistors. With this heat conduction layer, heat generated by the organic light emitting elements during lighting can be effectively conducted in a direction opposite to the array of the transistors, and influence of the heat generated by the organic light emitting elements on the performance of the active layer is further reduced.

According to embodiments of the present invention, the display backplane further comprises: an encapsulation layer for encapsulating the substrate on which the array of organic light emitting elements and the array of transistors are formed, wherein the heat conduction layer is formed between the array of organic light emitting elements and the encapsulation layer.

According to embodiments of the present invention, the display backplane further comprises: a cover plate and a heat dissipation layer arranged on a side of the encapsulation layer away from the array of organic light emitting elements, wherein the cover plate is arranged between the heat dissipation layer and the encapsulation layer. Therefore, the dissipation of heat generated by the organic light emitting elements out from the display is further accelerated.

According to embodiments of the present invention, the heat dissipation layer comprises a heat dissipation sheet and a heat dissipation pin, the heat dissipation pin being formed on a side of the heat dissipation sheet away from the cover plate.

The present invention further provides a method for manufacturing a display backplane, comprising:

forming on a substrate an array of organic light emitting elements and an array of transistors for driving and controlling the array of organic light emitting elements; and forming a heat insulation layer between the array of organic light emitting elements and the array of transistors, wherein the heat insulation layer is provided with a heat insulation layer via hole formed therein, through which the array of transistors is connected with the array of organic light emitting elements.

In a manner similar to the effect of the above display backplane provided in the present invention, with a display backplane manufactured using the above method of the present invention, the conduction of heat generated by the array of organic light emitting elements during lighting to the array of transistors can be reduced, and accordingly problems caused thereby such as uneven display can be avoided.

According to embodiments of the present invention, the method further comprises: forming a heat conduction layer on a side of the array of organic light emitting elements away from the array of transistors. Likewise, with this heat conduction layer, heat generated by the organic light emitting elements during lighting can be effectively conducted in a direction opposite to the array of the transistors, and influence of the heat generated by the organic light emitting elements on the performance of the active layer is further reduced.

According to embodiments of the present invention, the method further comprises: forming an encapsulation layer for encapsulating the substrate on which the array of organic light emitting elements and the array of transistors are formed; wherein the step of forming a heat conduction layer on a side of the array of organic light emitting elements away from the array of transistors comprises forming a heat conduction layer between the array of organic light emitting elements and the encapsulation layer.

According to embodiments of the present invention, the method further comprises: forming a cover plate and a heat dissipation layer on a side of the encapsulation layer away from the array of organic light emitting elements, wherein the cover plate is formed between the heat dissipation layer and the encapsulation layer. Likewise, with the heat dissipation layer, the dissipation of heat generated by the organic light emitting elements out from the display is further accelerated.

According to embodiments of the present invention, the method further comprises: forming a passivation layer between the array of organic light emitting elements and the array of transistors, wherein the heat insulation layer is positioned between the passivation layer and the bottom electrode of the organic light emitting element in the array of organic light emitting elements; and the passivation layer is provided with a passivation layer via hole formed therein, the position of which corresponds to that of the heat insulation layer via hole, and the drain of the transistor in the array of transistors is connected with the bottom electrode of the organic light emitting element in the array of organic light emitting elements via the passivation layer via hole and the heat insulation layer via hole.

Thus, mutual interferences between the array of organic light emitting elements and the array of transistors are avoided, and moreover, by taking advantage of a corresponding passivation layer via hole, the connection between the array of transistors and the array of organic light emitting elements is ensured.

Furthermore, the step of forming the heat insulation layer comprises:

coating a mixed material of a heat insulation material and a photoresist onto the passivation layer; and exposing and developing the mixed material coated onto the passivation layer using a photolithography process, to form a heat insulation layer provided with a heat insulation layer via hole.

The present invention further provides a display device, comprising the above display backplane.

The technical problem solved by the display device and its related effects are the same as those of the display backplane and the manufacturing method thereof as mentioned above, so no more details shall be described herein for simplicity.

DETAILED DESCRIPTION OF EMBODIMENTS

To illustrate embodiments of the present invention, the technical solution, and the advantages thereof even clearer, the technical solutions according to embodiments of the present invention shall be described as follows in a clear and complete manner with reference to the drawings in the embodiments of the present invention. Obviously, the embodiments described here are only a part of the embodiments of the present invention, rather than all of them. Based on the embodiments of the present invention, all other embodiments obtained by those having ordinary skill in the art without inventive efforts, shall fall within the protection scope of the present invention.

The display backplane of the present invention comprises: a substrate, an array of organic light emitting elements and an array of transistors for driving and controlling the array of organic light emitting elements formed on the substrate, and a heat insulation layer formed between the array of organic light emitting elements and the array of transistors, wherein the heat insulation layer is provided with a heat insulation layer via hole, through which the array of transistors is connected with the array of organic light emitting elements.

Since a heat insulation layer is formed between the array of organic light emitting elements and the array of transistors, and the heat insulation layer is provided with a heat insulation layer via hole, through which the array of transistors is connected with the array of organic light emitting elements, the conduction of heat generated by the array of organic light emitting elements during lighting to the array of transistors can be reduced, and accordingly problems caused thereby, such as uneven display, can be avoided.

Figure 1:
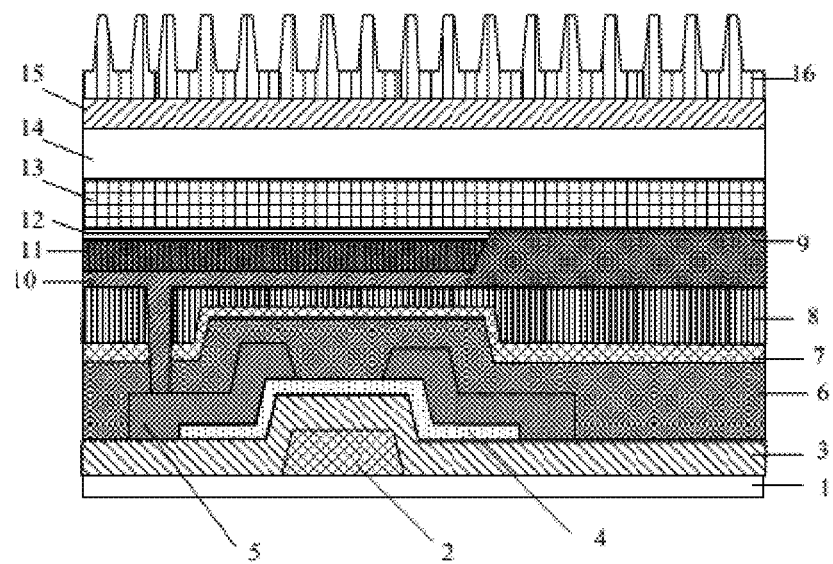
FIG. 1 is a schematic structural view of a display backplane provided according to embodiments of the present invention.

FIG. 1 is a schematic structural view of a display backplane provided according to embodiments of the present invention, wherein the display backplane comprises:

glass substrate 1; a gate electrode pattern 2 formed on the glass substrate 1; a gate insulation layer 3 formed over the gate electrode pattern 2 and the glass substrate 1; an active layer pattern 4 formed over the gate insulation layer 3; a source-drain electrode pattern 5 formed over the active layer pattern 4; a passivation layer 6 formed over the active layer pattern 4 and the source-drain electrode pattern 5; a heat insulation layer 7 formed over the passivation layer 6; a resin layer 8 formed over the heat insulation layer 7; a pixel defining layer pattern 9, a bottom electrode pattern 10, a light emitting layer pattern 11 and a top electrode pattern 12 formed over the resin layer 8; a heat conduction layer 13 formed over the pixel defining layer pattern 9 and the top electrode pattern 12; an encapsulation layer 14 formed over the heat conduction layer 13; cover plate glass 15 formed on the encapsulation layer 14; and a heat dissipation layer 16 formed over the cover plate glass 15. In this case, the active layer pattern 4 can be formed from semiconductor materials such as metal oxides, polycrystalline silicon, amorphous silicon and the like. Correspondingly, a passivation layer via hole, a heat insulation layer via hole, and a resin layer via hole are formed respectively in the passivation layer 6, the heat insulation layer 7 and the resin layer 8. The positions of the passivation layer via hole, the heat insulation layer via hole, and the resin layer via hole correspond with each other, and the top electrode pattern 12 is connected with the source-drain electrode pattern 5 via the above via holes having corresponding positions. The gate electrode pattern 2, the gate insulation layer 3, the active layer pattern 4, and the source-drain electrode pattern 5 here together form an array of transistors, and the bottom electrode pattern 10, the light emitting layer pattern 11 and the top electrode pattern 12 together form an array of organic light emitting elements. Glass substrate 1 is an instance for the substrate. Besides, the substrate can be formed from materials, such as transparent resin, quartz, sapphire and the like, which will not be limited in the present invention.

According to embodiments of the present invention, since the heat insulation layer 7 is formed between the passivation layer 6 and the bottom electrode pattern 10, the influence of heat generated by the organic light emitting elements during lighting on the performance of the array of transistors can be effectively avoided, and accordingly problems caused thereby such as uneven display brightness can be avoided. Meanwhile, according to embodiments of the present invention, since a heat conduction layer 13 is further formed over the top electrode pattern 12, heat generated by the organic light emitting elements during lighting can be effectively conducted in a direction opposite to the array of transistors, and hence the influence of heat generated by the organic light emitting elements during lighting on the performance of the active layer is further reduced. On the other hand, according to embodiments of the present invention, a heat dissipation layer 16 is further formed outside the cover plate glass 15, which can also further accelerate the dissipation of heat generated by the organic light emitting elements out form the display.

It should be noted that although FIG. 1 shows a situation where the heat insulation layer 7 is formed between the passivation layer 6 and the resin layer 8, the position of the heat insulation layer 7 is not limited thereto in an actual application. For example, the heat insulation layer can also be arranged between the resin layer 8 and the bottom electrode pattern 10, or the passivation layer 6 or the resin layer 8 can also be formed from a material having heat insulation function. As long as the heat insulation layer is arranged between the array of transistors and the array of organic light emitting elements such that respective solutions can all achieve the goal of reducing the influence of heat generated by the organic light emitting elements on the performance of the active layer, the corresponding technical solutions shall all fall within the protection scope of the present invention. In addition, structures such as a passivation layer, a resin layer and a pixel defining layer pattern are not necessarily present as they can be added or deleted upon the actual or design need. In specific implementations, when only the heat insulation layer 7 is arranged without the heat conduction layer 13 and/or the heat dissipation layer 16 in FIG. 1, such a technical solution can also reduce to a certain degree the influence of heat generated by the organic light emitting elements on the performance of the active layer, so the corresponding technical solution shall also fall within the protection scope of the present invention.

In an actual application, the heat insulation layer 7 here can consist of one or more materials with a low thermal conductivity. For example, the material of the heat insulation layer can have a thermal conductivity of 0-0.5 W/mK, such as polystyrene (the thermal conductivity of which is 0.08 W/mK), polyethylene (the thermal conductivity of which is 0.3 W/mK) and so on. The thickness of the heat insulation layer 7 can be 1-2 μm. In specific implementations, the heat insulation layer 7 here can be made by coating, evaporation or the like.

In specific implementations, in order to avoid breakage of the bottom electrode pattern 10, the slope angle of the heat insulation layer via hole can be arranged as smaller than or equal to 60°. For instance, in WOLED+COA (White OLED+Color filter On Array), if the heat insulation layer 7 is arranged between the passivation layer 6 and a color film layer, the slope angle of the heat insulation layer via hole can be arranged as smaller than or equal to 60°. If the heat insulation layer 7 is arranged over the resin layer 8 and between the bottom electrode pattern 10, the slope angle of the heat insulation layer via hole can be arranged as between 40-60°. Additionally or alternatively, in a PLED structure (a P-type LED), the heat insulation layer 7 can be deposited between the passivation layer 6 and the bottom electrode pattern 10, wherein the slope angle of the via hole is 40-60°.

When the above display backplane is a bottom emission type display backplane, the light transmittance of the heat insulation layer 7 can be arranged as greater than or equal to 95% so as to ensure the transmittance of the display backplane.

The material of the heat conduction layer 13 may have a thermal conductivity of 100 W/mK to 8000 W/mK. For instance, it can consist of one or more materials with a high thermal conductivity, such as silver, copper, gold, aluminum, diamond, graphite, graphene, carbon nanotube, and so on. The thickness of the heat conduction layer 13 can be 1-100 μm. The above materials can be deposited over the top electrode pattern 12 by sputtering, evaporation, coating or the like to form the heat conduction layer 13.

In an actual application, the material of the heat dissipation layer 16 can have a thermal conductivity of greater than 100 W/mK. For example, it can be one or more chosen from the following materials: silver, copper, gold, aluminum, diamond, graphite, grapheme, carbon nanotube, and so on.

Figure 2:
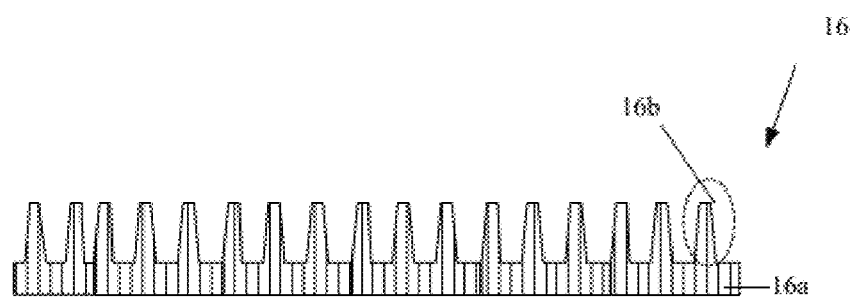
FIG. 2 is a schematic view of a possible structure for the heat dissipation layer 16 in FIG. 1.

As shown in FIG. 2, the heat dissipation layer 16 has a heat dissipation sheet 16a and a heat dissipation pin 16b, the heat dissipation pin 16b being formed on a side of the heat dissipation sheet 16a away from the cover plate glass 14. Such a structure has a better heat dissipation effect.

In specific implementations, the heat dissipation pin here has a height of at least 1 mm, and a width in a range of 1-5 mm, and the distance between adjacent heat dissipation pins 16b can be in a range of 2-5 mm.

In specific implementations, materials with a thermal conductivity of greater than 100 W/mK can be chosen as the material of the heat dissipation layer, such as one or more from the group consisting of silver, copper, gold, aluminum, diamond, graphite, grapheme, carbon nanotube and so on. The heat dissipation pin 16b may have different shapes and a larger surface area so as to dissipate heat more quickly. The heat dissipation pin 16b can be made by an etching process.

In specific implementations, the above display backplane can be either a bottom emission type display backplane or a top emission type display backplane. FIG. 1 shows a situation where it is a bottom emission type display backplane. The bottom electrode pattern 10 here can be an anode, and the corresponding top electrode pattern 12 is a cathode; or, the bottom electrode pattern 10 may be a cathode, and the corresponding top electrode pattern 12 is an anode. The above display backplane can be a WOLED backplane, a PLED backplane and the like as mentioned above.

In specific implementations, the above heat insulation layer via hole, the passivation layer via hole, and the resin layer via hole can be made by photolithography. Furthermore, the aperture of the heat insulation layer via hole can be arranged as greater than that of the passivation layer via hole, and the aperture of the resin layer can be arranged as greater than that of the heat insulation layer via hole.

In some applications, the above resin layer 8 is not an indispensable structure.

A further embodiment of the present invention also provides a method for manufacturing a display backplane, which can be used for manufacturing any display backplane as mentioned above. The method can comprise: forming on a substrate an array of organic light emitting elements and an array of transistors for driving and controlling the array of organic light emitting elements; and forming a heat insulation layer between the array of organic light emitting elements and the array of oxide transistors, wherein the heat insulation layer is provided with a heat insulation layer via hole formed therein, through which the array of oxide transistors is connected with the array of organic light emitting elements.

In specific implementations, the array of oxide transistors and the array of organic light emitting elements can be formed with reference to the prior art, and a heat insulation layer pattern can be formed between the array of oxide transistors and the array of organic light emitting elements which have been formed. Specifically, a gate electrode pattern, a gate insulation layer, an oxide active layer pattern, a source-drain electrode pattern, and a passivation layer can be formed on the substrate sequentially. Then a heat insulation layer pattern is formed over the passivation layer. After the formation of the heat insulation layer pattern, a resin layer, a bottom electrode pattern, a light emitting layer and a top electrode pattern are formed sequentially. If the display backplane to be manufactured is a top emission type display backplane, a reflective layer should also be formed prior to the formation of the gate electrode pattern.

In specific implementations, when the heat insulation layer pattern is formed directly on the passivation layer, the step of forming a heat insulation layer pattern and a passivation layer pattern may comprise:

forming a passivation layer;

mixing a heat insulation material with a photoresist in a certain proportion and then coating the mixture onto the passivation layer; and exposing and developing the mixed material layer coated onto the passivation layer using a same mask plate by a photolithography process to form a pattern of the heat insulation layer via hole, and then forming a passivation layer via hole by dry etching.

The passivation layer via hole formed in the above manner can have a smaller slope angle, thereby avoiding breakage of the bottom electrode pattern.

Furthermore, the above method can further comprise: forming a heat conduction layer on a side of the array of organic light emitting elements away from the array of oxide transistors. The heat conduction layer here can be formed on a surface of the top electrode pattern by sputtering, evaporation, coating or the like.

Furthermore, the above method can further comprise: forming an encapsulation layer for encapsulating the substrate on which the array of organic light emitting elements and the array of oxide transistors are formed.

Here, the step of forming a heat conduction layer on a side of the array of organic light emitting elements away from the array of oxide transistors comprises:

forming a heat conduction layer between the array of organic light emitting elements and the encapsulation layer.

Furthermore, the method can further comprise: forming a cover plate and a heat dissipation layer on a side of the encapsulation layer away from the array of organic light emitting elements, wherein the cover plate is formed between the heat dissipation layer and the encapsulation layer.

In specific implementations, the heat dissipation layer here can be made from a thermally conductive material, and the structure of the heat dissipation layer formed here can be identical to that shown in FIG. 2. The heat dissipation pin therein may be made by an etching process, and the height of the heat dissipation pin can be controlled by controlling the etching time.

It should be noted that although descriptions are provided in the above embodiments by taking the transistors in the display backplane as oxide transistors, in an actual application, the solution provided in the present invention can also achieve similar effects in a display backplane comprising transistors of other types. Therefore, the corresponding technical solutions shall also fall within the protection scope of the present invention.

A further embodiment of the present invention further provides a display device comprising any one of the above display backplanes. The display device can be any product or component having a display function, including: an OLED panel, a cell phone, a tablet computer, a television, a display, a notebook computer, a digital photo frame, a navigator, and so on.

The specific embodiments of the present invention described herein are for explanatory purposes and not intended for limitation of the present invention. Any modification or substitution easily conceivable for any one who is familiar with the art within the technical disclosure of the present invention shall be covered by the protection scope of the present invention. Therefore, the protection scope of the present invention should be subject to the protection scope of the claims.

The invention claimed is:

1. A display backplane, comprising:
   a substrate;
   an array of organic light emitting elements and an array of transistors for driving and controlling the array of organic light emitting elements formed on the substrate; and
   a heat insulation layer formed between the array of organic light emitting elements and the array of transistors, wherein
   the heat insulation layer is provided with a heat insulation layer via hole, through which the array of transistors is connected with the array of organic light emitting elements, and
   the display backplane further comprises: a heat conduction layer formed on a side of the array of the organic light emitting elements away from the array of the transistors;
   an encapsulation layer for encapsulating the substrate on which the array of organic light emitting elements and the array of transistors are formed, wherein the heat conduction layer is formed between the array of organic light emitting elements and the encapsulation layer;

a cover plate and a heat dissipation layer arranged on a side of the encapsulation layer away from the array of organic light emitting elements, wherein the cover plate is arranged between the heat dissipation layer and the encapsulation layer, wherein the heat dissipation layer comprises a heat dissipation sheet and a heat dissipation pin, the heat dissipation pin being formed on a side of the heat dissipation sheet away from the cover plate.

2. The display backplane according to claim 1, further comprising: a passivation layer formed between the array of organic light emitting elements and the array of transistors, wherein the heat insulation layer is positioned between the passivation layer and the bottom electrode of the organic light emitting element in the array of organic light emitting elements;

wherein the passivation layer is provided with a passivation layer via hole formed therein, the position of which corresponds to that of the heat insulation layer via hole;

and wherein the drain of the transistor in the array of transistors is connected with the bottom electrode of the organic light emitting element in the array of organic light emitting elements via the passivation layer via hole and the heat insulation layer via hole.

3. The display backplane according to claim 2, wherein the slope angle of the heat insulation layer via hole is smaller than or equal to 60°.

4. The display backplane according to claim 3, wherein the slope angle of the heat insulation layer via hole is 40-60°.

5. The display backplane according to claim 1, wherein the slope angle of the heat insulation layer via hole is smaller than or equal to 60°.

6. The display backplane according to claim 5, wherein the slope angle of the heat insulation layer via hole is 40-60°.

7. A method for manufacturing a display backplane, comprising:

forming on a substrate an array of organic light emitting elements and an array of transistors for driving and controlling the array of organic light emitting elements; and forming a heat insulation layer between the array of organic light emitting elements and the array of transistors, wherein the heat insulation layer is provided with a heat insulation layer via hole formed therein, and wherein the array of transistors is connected with the array of organic light emitting elements through the insulation layer via hole, and the method further comprises: forming a heat conduction layer on a side of the array of organic light emitting elements away from the array of transistors;

forming a passivation layer between the array of organic light emitting elements and the array of transistors, wherein the heat insulation layer is positioned between the passivation layer and the bottom electrode of the organic light emitting element in the array of organic light emitting elements; and the passivation layer is provided with a passivation layer via hole formed therein, the position of which corresponds to that of the heat insulation layer via hole, and the drain of the transistor in the array of transistors is connected with the bottom electrode of the organic light emitting element in the array of organic light emitting elements via the passivation layer via hole and the heat insulation layer via hole, wherein the step of forming the heat insulation layer comprises:

coating a mixed material of a heat insulation material and a photoresist onto the passivation layer; and exposing and developing the mixed material coated onto the passivation layer using a photolithography process, to form a heat insulation layer provided with a heat insulation layer via hole.

8. The method according to claim 7, further comprising:

forming an encapsulation layer for encapsulating the substrate on which the array of organic light emitting elements and the array of transistors are formed; wherein the step of forming a heat conduction layer on a side of the array of organic light emitting elements away from the array of transistors comprises:

forming a heat conduction layer between the array of organic light emitting elements and the encapsulation layer.

9. The method according to claim 8, further comprising:

forming a cover plate and a heat dissipation layer on a side of the encapsulation layer away from the array of organic light emitting elements, wherein the cover plate is formed between the heat dissipation layer and the encapsulation layer.

10. A display device, comprising a display backplane, the display backplane comprising:

a substrate;

an array of organic light emitting elements and an array of transistors for driving and controlling the array of organic light emitting elements formed on the substrate; and a heat insulation layer formed between the array of organic light emitting elements and the array of transistors, wherein the heat insulation layer is provided with a heat insulation layer via hole, through which the array of transistors is connected with the array of organic light emitting elements, and the display backplane further comprises: a heat conduction layer formed on a side of the array of the organic light emitting elements away from the array of the transistors;

an encapsulation layer for encapsulating the substrate on which the array of organic light emitting elements and the array of transistors are formed, wherein the heat conduction layer is formed between the array of organic light emitting elements and the encapsulation layer;

a cover plate and a heat dissipation layer arranged on a side of the encapsulation layer away from the array of organic light emitting elements, wherein the cover plate is arranged between the heat dissipation layer and the encapsulation layer, wherein the heat dissipation layer comprises a heat dissipation sheet and a heat dissipation pin, the heat dissipation pin being formed on a side of the heat dissipation sheet away from the cover plate.

11. The display device according to claim 10, wherein the display backplane further comprises: a passivation layer formed between the array of organic light emitting elements and the array of transistors, wherein the heat insulation layer is positioned between the passivation layer and the bottom electrode of the organic light emitting element in the array of organic light emitting elements;

wherein the passivation layer is provided with a passivation layer via hole formed therein, the position of which corresponds to that of the heat insulation layer via hole;

and wherein the drain of the transistor in the array of transistors is connected with the bottom electrode of the organic light emitting element in the array of organic light emitting elements via the passivation layer via hole and the heat insulation layer via hole.

12. The display device according to claim 10, wherein the slope angle of the heat insulation layer via hole is smaller than or equal to 60°.

* * * * *